United States Patent [19]

Blauvelt et al.

[11] Patent Number: 4,992,754
[45] Date of Patent: Feb. 12, 1991

[54] PREDISTORTER FOR LINEARIZATION OF ELECTRONIC AND OPTICAL SIGNALS

[75] Inventors: Henry A. Blauvelt; Howard L. Loboda, both of Los Angeles, Calif.

[73] Assignee: Ortel Corporation, Alhambra, Calif.

[21] Appl. No.: 404,186

[22] Filed: Sep. 7, 1989

[51] Int. Cl.$^5$ .............................................. H03F 1/32
[52] U.S. Cl. ..................................... 330/149; 328/163
[58] Field of Search ............... 330/149; 328/143, 144, 328/163; 332/160; 455/50, 63

[56] References Cited

U.S. PATENT DOCUMENTS 4,068,186  1/1978  Sato et al. ........................... 330/149

Primary Examiner—James B. Mullins
Attorney, Agent, or Firm—Christie, Parker & Hale

[57] ABSTRACT

An electronic circuit provides a linear output from an amplitude modulated transmission device such as a solid state laser which has inherent distortion. The distortion of the nonlinear device is compensated by applying a predistorted signal equal in magnitude and opposite in sign to the distortion introduced by the nonlinear device. The input signal is split into two paths with primary part of the signal applied directly to the device, with a time delay to compensate for delays in the secondary path. A predistorter in the secondary path generates harmonic signals, the amplitude of which is adjusted to match the amplitude of the distortion. A tilt adjustment is made to compensate the amplitude of the predistortion for frequency dependence of distortion. A fine adjust of the delay is also included so that phase of the predistortion signal is in proper phase relation with the primary signal. A push-push amplifier is used as a distorter, with bias current unbalanced to produce net odd harmonics as well as even harmonics of the fundamental frequencies.

23 Claims, 3 Drawing Sheets

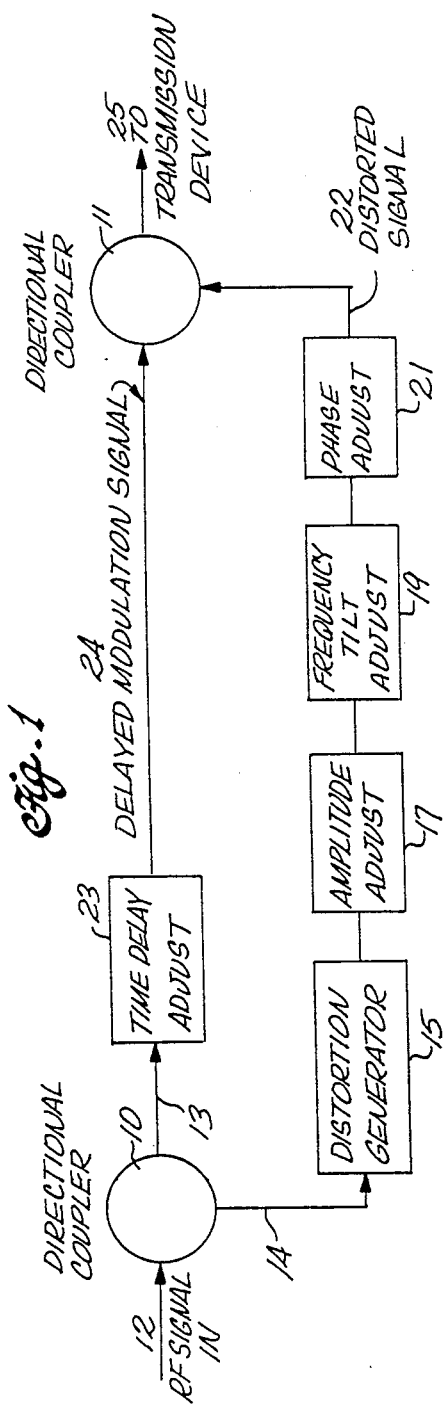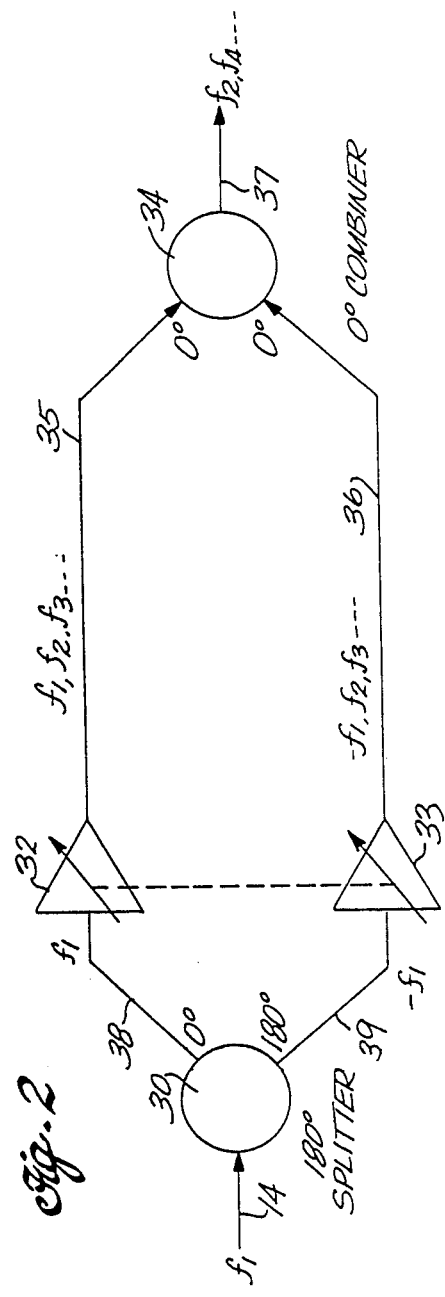

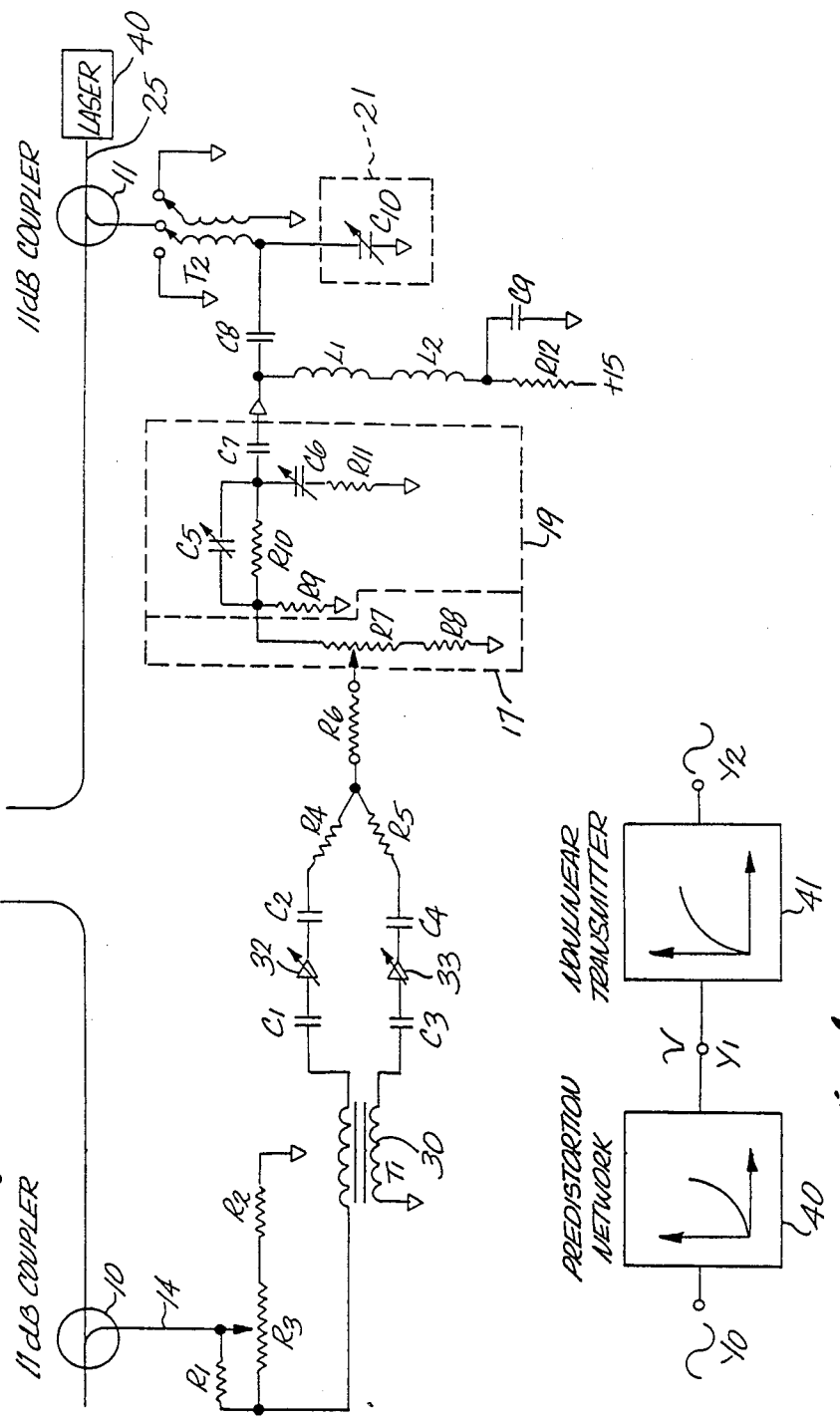

PREDISTORTER FOR LINEARIZATION OF ELECTRONIC AND OPTICAL SIGNALS

FIELD OF THE INVENTION

This invention relates to an electronic circuit for providing a linear output from an amplitude modulated transmission device such as a semiconductor laser which has an output distorted from its input due to inherent nonlinearity. The distortion of the nonlinear device is compensated by applying a predistorted signal to the input of the nonlinear device. The predistortion is chosen such that the distortion of the nonlinear device restores the undistorted signal.

BACKGROUND OF THE INVENTION

Directly modulating the analog intensity of a light-emitting diode (LED) or semiconductor laser with an electrical signal is considered among the simplest methods known in the art for transmitting analog signals, such as sound and video signals, on optical fibers. Although such analog techniques have the advantage of significantly smaller bandwidth requirements than digital pulse code modulation, or analog or pulse frequency modulation, amplitude modulation may suffer from noise and nonlinearity of the optical source.

Distortion inherent in certain analog transmitters prevents a linear electrical modulation signal from being converted linearly to an optical signal, and instead causes the signal to become distorted. These effects are particularly detrimental to multi-channel video transmission which requires excellent linearity to prevent channels from interfering with each other. A highly linearized analog optical system has wide application in commercial TV transmission, CATV, interactive TV, and video telephone transmission.

Linearization of optical and other nonlinear transmitters has been studied for some time, but proposed solutions suffer from practical disadvantages. Most applications have bandwidths which are too large for practical use. Feedforward techniques require complex system components such as optical power combiners and multiple optical sources. Quasi-optical feedforward techniques suffer from similar complexity problems and further require extremely well-matched parts.

One method employed in the past to reduce distortion inherent in nonlinear devices has been predistortion. In this technique, a modulation signal is combined with a signal equal in magnitude to the distortion inherent in the nonlinear device but opposite in sign. When the nonlinear device modulates the combined signal, the device's inherent distortion is canceled by the combined signal's predistortion and only the linear part of the source signal is transmitted. This predistortion signal is usually in the form of additive and subtractive combinations of the input fundamental frequencies as these intermodulation products constitute the most fertile source of distortion in analog signal transmission. In the distribution of AM signals for cable television, for example, there are often as many as 40 frequencies on a particular band and plenty of opportunities for second order and third order intermodulation products of those frequencies.

Current predistortion techniques generally divide an input signal into two or more electrical paths and generate predistortion on one or more of the paths resembling the distortion inherent in the nonlinear transmitting device. The generated predistortion is the inverse of the nonlinear device's inherent distortion and serves to cancel the effect of the device's inherent distortion when recombined with the input signal.

Attenuation can be used to match the magnitude of the predistortion to the magnitude of the device's inherent distortion characteristics before the signals are recombined and sent to the nonlinear device for modulation. However, the method suffers from crudeness because nonlinear devices frequently have amplitude and phase distortion characteristics dependent on the frequency of the modulating signal. Present techniques provide no means for compensating for these frequency-dependent nonlinearities.

Neglecting to correct for the frequency dependence of the distortion leads to a result which may be quite tolerable for many systems and for signals with relatively narrow bandwidth. However, they become particularly troublesome when converting an electrical TV signal to an optical signal for cable transmission. Such signals for cable TV may have forty or more input frequencies, all of which need to have high quality amplitude modulated signals. The transmission devices for such signal must have an exceptionally high degree of linearity.

The present invention accordingly is addressed to these and other difficulties found in the prior art.

SUMMARY OF THE INVENTION

Thus, in practice of this invention according to a presently preferred embodiment, a predistortion circuit for reducing distortion in the transmission of analog signals splits an input modulation signal into two electrical paths, one primary and one secondary. A predistortion amplifier on the secondary path generates second order or higher order intermodulation distortion products of the input signal. The distortion so generated, or predistortion, is adjusted to be substantially equal in magnitude and opposite in sign to the distortion inherent in a nonlinear modulation device to which the signal is applied. The predistortion signal is adjusted in amplitude and phase to match the frequency dependence of the distortion by the nonlinear device. The phase of the signals are synchronized by a delay or phase adjustment element in one of the electrical paths. The primary and secondary signals are then recombined to produce a single modulation signal including intermodulation product distortion. Thus, the predistortion circuit largely linearizes the transmission of modulating signals by cancelling distortion inherent in nonlinear transmitting devices.

BRIEF DESCRIPTION OF THE DRAWINGS

These and other features and advantages of this invention will be better understood and more fully appreciated by reference to the following detailed description when considered in conjunction with the accompanying drawings, wherein:

FIG. 1 is a block diagram showing a presently preferred embodiment of a predistortion circuit;

FIG. 2 is a block diagram of a push-push amplifier employed in the predistortion circuit according to a preferred embodiment of this invention;

FIG. 3 is a schematic diagram exemplifying a practical predistortion circuit;

FIG. 4 is an illustration of the effect of predistortion on the waveforms of a modulation signal.

DETAILED DESCRIPTION

Figure 5:
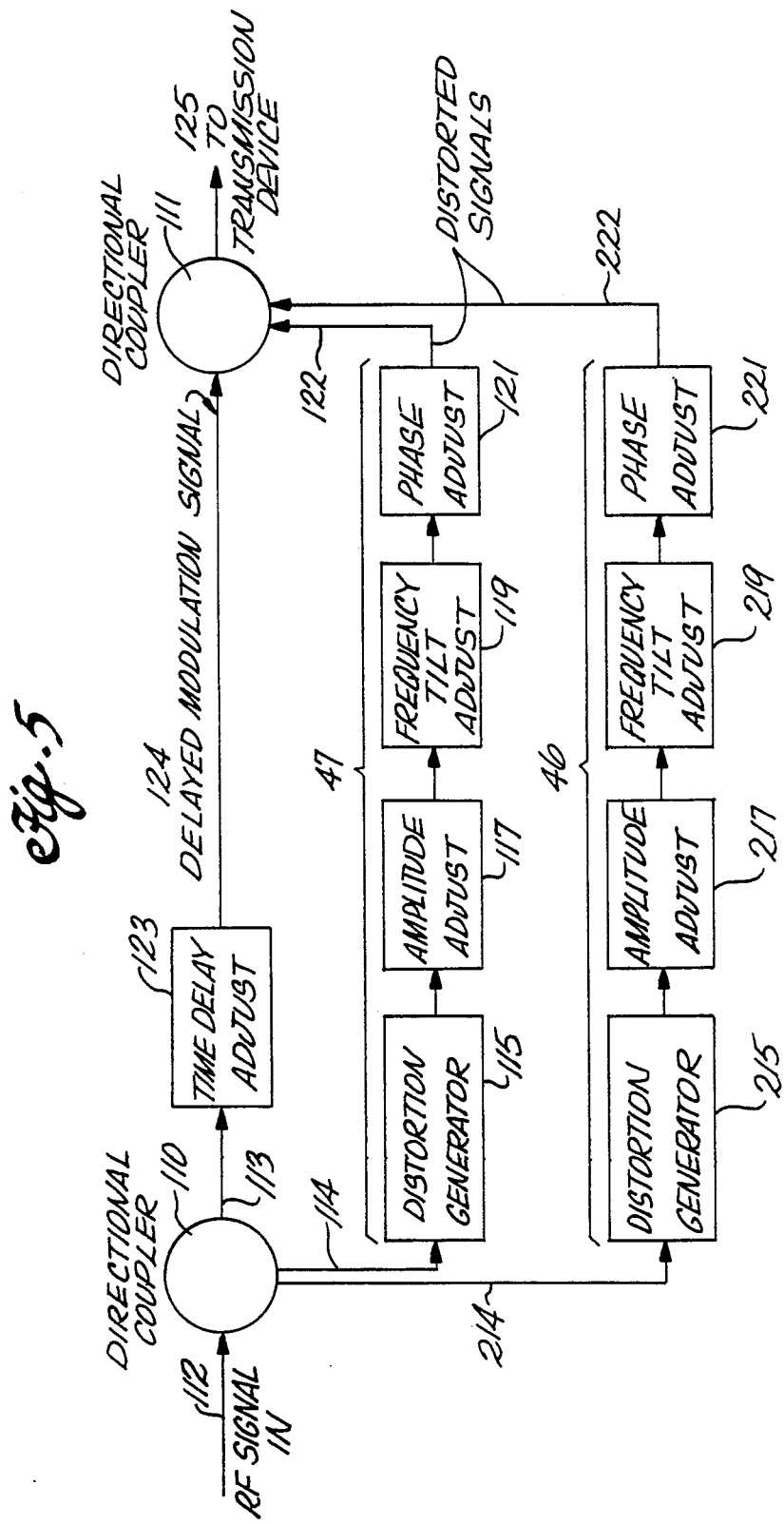
FIG. 5 is a block diagram showing a predistortion circuit with more than one "secondary" path.

The concept of predistortion is shown abstractly in FIG. 4. An input signal $Y_0$ is input to a predistortion network 40. The predistortion network has a nonlinear transfer function which deviates from linearity oppositely and inversely from the deviation of a nonlinear transmitter having a known transfer function 41. The signal $Y_1$ from the predistortion network is a combination of the input source signal $Y_0$ and predistortion resulting from the nonlinear transfer function 40. Signal $Y_1$ is fed into the nonlinear transmitter and, after modulation by the transmitter, appears as a substantially linear signal $Y_2$ as a result of the inherent distortion of the transmitter inversely related to and cancelled by the predistortion of signal $Y_1$.

Referring now to FIG. 1, an input source signal 12 feeds into a directional coupler 10 and is split into a primary electrical path 13 and a secondary electrical path 14. Typically, the portion of the signal on the primary electrical path is substantially larger in power than the signal on the secondary electrical path. For example, an 11 dB directional coupler may be used to achieve this result.

The secondary electrical path comprises in circuit series a distortion generator 15, an amplitude adjustment block 17, a "tilt" or frequency adjustment block 19, and a fine phase adjustment block 21. These elements may be varied in order along the secondary electrical path without departing from the functional purpose of the invention.

In one embodiment, the signal on the secondary electrical path feeds first into the distortion generator. The output of the distortion generator comprises intermodulation distortion of the input frequencies. Second order or second and higher order distortion may be produced. Ideally, the fundamental frequency is suppressed in the distortion generator by cancellation, filtering or other means. The intermodulation product so generated is opposite in phase to the input signal. This inversion may be accomplished within the distortion generator or with a separate inverter element (not shown).

The distorted output from the distortion generator is matched in magnitude to the magnitude of inherent distortion predicted in the transmission device (not shown in FIG. 1) receiving the output signal 25. The matching function occurs in the amplitude adjustment block 17 and this adjustment may be accomplished manually with a variable attenuator or dynamically with an automatic gain control element, for example. The output of the amplitude adjustment block 17, therefore, comprises intermodulation distortion of a small portion of the input signal and is substantially equal in magnitude and opposite in sign to distortion inherent in a nonlinear transmission device receiving the output signal 25 of the predistortion circuit. This output or predistortion signal effectively reduces the frequency independent component of the distortion of the nonlinear device.

Generation of the predistortion signal on the secondary electrical path typically involves a time delay relative to the primary electrical path. Before the primary and secondary paths are recombined an adjustment is made to set the relative phase of the primary path electrical signal with respect to the phase of the secondary path electrical signal which results in best cancellation of the distortion inherent in the nonlinear device. This phase matching is done on the primary electrical path by an external delay 23 which receives the primary portion of the signal 13 split by the directional coupler 10. The time delay may be manually or automatically adjusted. An exemplary delay may be simply a transmission line of selected length to introduce a suitable delay.

An exemplary transmission device may be a semiconductor laser or LED modulated by the output signal. The inherent distortion of such a device is not independent of frequency. Generally speaking, the distortion is inherently greater at higher frequencies.

To adjust for frequency dependent distortion of the nonlinear transmitting device, the output of the amplitude adjustment block is then fed into a frequency adjustment or "tilt" adjustment block 19. The tilt adjustment is a variable filter or other similar means which increases the amplitude of the distortion at high frequencies for an "up-tilt" and decreases it at high frequencies for a "down-tilt." This adjustment, like the amplitude adjustment, may be done either manually or automatically. By passing more or less of the high-frequency distortion products than the low-frequency distortion products, the tilt adjustment enables the predistortion signal to be tailored more precisely to the inherent distortion characteristics of the nonlinear device.

Typically, the amplitude adjustment is made to compensate for the distortion occurring at the low frequency end of the band. The frequency adjustment is then made as an up-tilt to compensate for distortion at the high frequency end of the band. It may be noted that this same effect can be achieved by amplitude adjustment at the high frequency end, and an up-tilt or down-tilt on the low-frequency end as an appropriate attenuation or amplification of the signal.

An additional fine phase adjustment block 21 on the secondary electrical path provides for more accurate setting of the relative phase between the distortion generated in the secondary path and the distortion inherent in the nonlinear device. This adjustment, like the amplitude adjustment, may also be made manually and may be frequency dependent. It is found that manual adjustment of amplitude, frequency and phase is usually completed in less than a minute. What one does is make the appropriate adjustment while observing the distortion in the output of the nonlinear device. The adjustment seeks to minimize the final distortion. The optimum adjustment is when the predistortion signal is of the same magnitude as the distortion inherent in the nonlinear device, and the predistortion is exactly 180° out of phase with the distortion.

It is significant that the phase adjustment is made relative to the distortion of the device. Previously time delays have been introduced so that the predistortion is exactly in phase (or 180° out of phase) with the primary signal. This may be sufficient for some purposes, but is not suitable for others, such as TV bandwidth modulation of a laser, for example.

Once the relative phases of the signals on the primary and secondary electrical paths have been set, they are recombined by the output directional coupler 11. The combined signal 25, including the predistortion component from the secondary path, is output to a nonlinear transmission device for modulation of the signal.

An example of a predistorter or distortion amplifier block 15 is shown in detail in FIG. 2. A portion of the input signal 14 on the secondary electrical path is fed into a 180° splitter 30 which divides the signal into a first electrical path 38 and a second electrical path 39 of equal magnitude and opposite sign. If desired, the signals so divided need not be of equal magnitude if subsequently amplified or attenuated.

The first electrical path feeds into a first amplifier 32 generating second order and higher order intermodulation products of the fundamental frequencies in the input signal 14. The second electrical path, carrying a signal opposite in sign to the first electrical path, feeds into a second amplifier 33 generating even order intermodulation products which are of the same sign as those output by the first amplifier 32, but generating odd order intermodulation products opposite in sign to those output by the first amplifier. The signals are combined additively by a 0-degree combiner 34 which substantially reduces the fundamental frequencies and odd order intermodulation products, leaving even order intermodulation product components in an output signal 37. Ideally, this process produces pure second order and higher order even components of intermodulation distortion.

The first and second amplifiers 32 and 33 are adjustable to prevent complete cancellation of the odd order intermodulation product components. This adjustment can be accomplished by varying the bias currents to the amplifiers which has little effect on gain of the fundamental frequencies. An increase in the bias current of the first amplifier 32 with a corresponding decrease in the bias current of the second amplifier 33 will unbalance the two amplifiers in the sense that the magnitude of intermodulation products produced will no longer be identical between the two amplifiers. Thus, the odd order intermodulation products will not cancel one another.

The unbalancing of this distortion circuit, which is referred to as a push-push amplifier, allows generation of intermodulation distortion of all orders of interest for predistortion purposes. The fundamental frequencies may be suppressed by particular amplifier design or by filtering means either in series with, after or integral to each amplifier. Preferably, the bias currents of both amplifiers 32 and 33 are adjusted in equal and opposite directions or senses, so that the unbalance affects only the odd order intermodulation products and the even order intermodulation products remain balanced and substantially unchanged in magnitude.

One embodiment of the predistortion circuit is shown in FIG. 3. The signal 14 in the secondary path from the signal splitting coupler 10 is first attenuated by way of an adjustable attenuator $R_1$, $R_3$ to assure a constant signal level. If the signal is too small there may not be sufficient distortion to compensate for the distortion of the transmission device. Conversely, if the signal is too large, the distorter could be overloaded and itself produce unacceptable distortion.

The attenuated signal is split in the 180° splitter 30, and capacitively coupled to the first and second amplifiers 32 and 33. The bias of the amplifiers is adjusted to obtain the desired third order and higher order intermodulation products, and the recombined signal is attenuated by way of the amplitude adjustment 17 to obtain the desired amount of distortion at relatively low frequencies, such as 50 MHz. Next one checks the higher frequency end of the band and adjusts the frequency filter 19 until the distortion matches the inherent distortion of the transmission device at this higher frequency. This has little effect on the predistortion at the lower frequency end of the band. It, in effect, tilts the amplitude as a function of frequency around a pivot near the low end of the band.

The time delay 23 is adjusted at the high frequency end of the band to adjust the phase of the signal in the primary signal path. Again, this has little effect at the low frequency end of the band. Finally, the phase adjustment 21 is used to more precisely adjust the phase of the predistortion generated in the secondary path to compensate for the phase distortion by the nonlinear device. If need be, the adjustment sequence can be repeated to more closely match the inherent distortion of the transmission device. Ordinarily, the initial attenuator and the bias of the predistortion amplifiers need not be adjusted, but may remain in a preset state. The three adjustments of the amplitude, tilt, and phase are sufficient. The principal delay in the primary path may also be fixed for a given secondary path.

The signal in the secondary path is recombined with the signal in the primary path by way of the directional coupler 11, and the signal 25 thereby predistorted is applied to a laser 40 or the like for modulation.

Many variations and modifications will be apparent to those skilled in the art without departing from the spirit and scope of the invention. For example, although described and illustrated in the context of a TV signal modulating a laser or light emitting diode, other nonlinear devices such as amplifiers may have inherent distortion largely cancelled by this technique. The fine adjustment of the relative phase of the signals in the primary and secondary paths is in the secondary path in the illustrated embodiment, but this could also be in the primary path with the coarse adjustment. The secondary path is preferred since such a delay in the primary path may have an inappropriate impedance for this path.

In the previously described embodiment, there is a single secondary signal path with its distortion generator. If desired, as shown in FIG. 5, a third "secondary" path 46 could be employed with one path 47 generating second order cancellation signals and another path 46 generating third order cancellation signals. In each of the secondary paths illustrated in FIG. 5, reference numerals are used for components which are 100 or 200 larger than the reference numerals used for like components in FIG. 1 of the drawings. Each of these paths may have its own adjustment for frequency dependence 119, 279 of amplitude and phase. In such an embodiment it is preferred to have fine adjustment of phase 121, 221 in each of the secondary paths. In the event two or more secondary paths are used for higher order distortion, the amplitude, tilt and phase in either path may be adjusted first since there is no interaction between them.

Because of such variations, the invention may be practiced other than as specifically described.

What is claimed is:

1. A predistortion circuit comprising:
   means for splitting an input modulation signal for a nonlinear device into a primary electrical path and a secondary electrical path;
   means for generating at least second order intermodulation products in the secondary electrical path having a relative amplitude corresponding to the amplitude of distortion in the nonlinear device and for suppressing fundamental frequencies of the modulation signal;
   filtering means in series with the means for generating intermodulation products for adjusting the amplitude of the signal on the secondary electrical path as a function of frequency for providing frequency dependent predistortion on the secondary path;

means for adjusting the relative phase of the intermodulation products and the distortion of the nonlinear device; and means for additively recombining the primary and secondary paths into a single path to form a signal composed of the fundamental signal and frequency dependent intermodulation product predistortion for application to the nonlinear device.

2. A predistortion circuit as claimed in claim 1 comprising time delay means in the primary electrical path for compensating relative phase difference between the primary and secondary electrical paths.

3. A predistortion circuit as claimed in claim 2 wherein the means for adjusting phase is in series with the other elements in the secondary electrical path for compensating relative phase difference between the secondary path and the nonlinear device.

4. A predistortion circuit as claimed in claim 2 wherein the primary electrical path carries a major portion of the input signal power.

5. A predistortion circuit comprising:

means for splitting an input modulation signal for a nonlinear device into a primary electrical path and a secondary electrical path;

a push-push amplifier for generating at least second order intermodulation products in the secondary electrical path having a relative amplitude corresponding to the amplitude of distortion in the nonlinear device;

filtering means in series with the means for generating intermodulation products for adjusting the amplitude of the signal on the secondary electrical path as a function of frequency for providing frequency dependent predistortion on the secondary path;

means for adjusting the relative phase of the intermodulation products and the distortion of the nonlinear device; and means for additively recombining the primary and secondary paths into a single path to form a signal composed of the fundamental signal and frequency dependent intermodulation product predistortion for application to the nonlinear device.

6. A predistortion circuit as claimed in claim 5 wherein the push-push amplifier comprises:

means for splitting the signal in the secondary electrical path signal into first and second electrical paths, said signals being equal in magnitude and opposite in sign;

first amplification means in the first electrical path for generating positive intermodulation products of the signal carried on the path;

second amplification means in the second electrical path for generating positive even order intermodulation products and negative odd order intermodulation products of the signal carried on the path; and signal combining means for additively recombining the first and second electrical paths after the intermodulation products have been generated, thereby at least partially cancelling the odd order intermodulation product components.

7. A predistortion circuit as claimed in claim 6 wherein the push-push amplifier further includes biasing means for unbalancing the first and second amplification means such that cancellation of the odd order intermodulation products is not complete, thereby producing a predistortion signal comprising even and odd order intermodulation products.

8. A predistortion circuit as claimed in claim 7 wherein the biasing means includes a first sense of adjustment to the bias current of the first amplification means and an opposite sense of adjustment to the second amplification means for maintaining substantially constant magnitude even order intermodulation products.

9. A predistortion circuit as claimed in claim 6 comprising means in the secondary electrical path for suppressing the fundamental frequencies in the modulation signal.

10. A predistortion circuit as claimed in claim 9 wherein the means for suppressing comprises the first and second amplification means.

11. A predistortion circuit comprising:

a first directional coupler for splitting an input modulation signal into primary and secondary electrical paths;

a distortion amplifier in series with the secondary electrical path for producing at least second order intermodulation products of the input frequencies and suppressing the fundamental frequencies in the modulation signal;

a time delay in the primary electrical path for reducing the relative phase difference between the primary and secondary electrical paths;

a second directional coupler for recombining the primary and secondary signal paths into a single signal for modulating a nonlinear device with predictable distortion characteristics; and a time delay in one of the electrical paths for compensating relative phase difference between the intermodulation products in the secondary electrical path and the distortion of the nonlinear device.

12. A predistortion circuit as claimed in claim 11 further comprising filter means in the secondary electrical path for adjusting the relative amplitude and phase of the signal as a function of frequency such that the modulation signal is predistorted for offsetting a frequency dependent distortion of the nonlinear device.

13. A predistortion circuit comprising:

a first directional coupler for splitting an input modulation signal into primary and secondary electrical paths;

a distortion amplifier in series with the secondary electrical path for producing at least second order intermodulation products of the input frequencies;

a time delay in the primary electrical path for reducing the relative phase difference between the primary and secondary electrical paths;

a second directional coupler for recombining the primary and secondary signal paths into a single signal for modulating a nonlinear device with predictable distortion characteristics; and a time delay in one of the electrical paths for compensating relative phase difference between the intermodulation products in the secondary electrical path and the distortion of the nonlinear device; and wherein the input signal is split into a plurality of secondary paths, each path comprising means for generating one or more orders of intermodulation products of the input modulation signal.

14. A predistortion circuit comprising:

a first directional coupler for splitting an input modulation signal into primary and secondary electrical paths;

a push-push distortion amplifier in series with the secondary electrical path for producing at least second order intermodulation products of the input frequencies;

a time delay in the primary electrical path for reducing the relative phase difference between the primary and secondary electrical paths;

a second directional coupler for recombining the primary and secondary signal paths into a single signal for modulating a nonlinear device with predictable distortion characteristics; and a time delay in one of the electrical paths for compensating relative phase difference between the intermodulation products in the secondary electrical path and the distortion of the nonlinear device.

15. A predistortion circuit as claimed in claim 14 wherein the push-push amplifier includes biasing means for unbalancing the amplifier so that odd order intermodulation products are not entirely cancelled, thereby producing a predistortion signal comprising even and odd order intermodulation products.

16. A predistortion circuit as claimed in claim 14 wherein the primary electrical path carries a major portion of the input signal power.

17. An amplifier for producing intermodulation products of frequencies in an input signal comprising:

means for splitting the input signal into first and second electrical paths, said signals being equal in magnitude and opposite in sign;

first amplification means in the first electrical path for generating positive intermodulation products of the signal carried on the path;

second amplification means in the second electrical path for generating positive even order intermodulation products and negative odd order intermodulation products of the signal carried on the second path;

signal combining means for additively recombining the first and second electrical paths after the intermodulation products have been produced, thereby cancelling at least a portion of the odd order intermodulation product components; and biasing means for unbalancing the first and second amplification means such that cancellation of the odd order intermodulation products is not complete, thereby producing a signal comprising even and odd order intermodulation products.

18. An amplifier as claimed in claim 17 wherein the biasing means includes means for increasing a bias current for either the first or second amplification means and means for proportionally decreasing the bias current for the other amplification means such that the odd order intermodulation products are prevented from cancelling and the even order intermodulation products do not change substantially in magnitude.

19. A distortion amplifier for producing second order and higher order intermodulation products of an input frequency comprising:

a 180° splitter dividing a source signal into first and second electrical paths, the signal on the first path being equal in magnitude and opposite in sign to the signal on the second path;

first and second amplification means in each of the first and the second electrical paths, respectively, for generating intermodulation products of the input signal of substantially equal magnitude, such that the even and odd order intermodulation products so generated are opposite in sign;

a zero-degree combiner additively recombining the first and second electrical paths after the intermodulation products have been generated, thereby cancelling the fundamental and odd order intermodulation product components; and biasing means for unbalancing the first and second amplification means such that the odd order intermodulation products are not entirely cancelled, thereby producing a signal comprising even and odd order intermodulation products.

20. An amplifier as claimed in claim 19 wherein the biasing means includes first means for increasing a bias current for either the first or second amplification means and second means for decreasing the bias current for the other amplification means, the first and second bias current means being sufficiently matched that the even order intermodulation products generated do not change substantially in magnitude and the odd order intermodulation products generated from the first and second amplification means are unequal in magnitude and thereby do not cancel.

21. The method of reducing distortion in an amplitude modulated signal from a nonlinear modulating device comprising the steps of:

splitting an input modulation signal into primary and secondary electrical paths;

generating at least second order intermodulation distortion in the secondary electrical path and adjusting the magnitude of the intermodulation distortion to be equal in magnitude and opposite in sign to distortion inherent in a nonlinear modulating device;

suppressing the fundamental frequencies of the modulated signal in the secondary electrical path;

adjusting the amplitude and phase of the intermodulation distortion in the secondary electrical path as a function of frequency to match the frequency dependence of distortion inherent in the modulating device;

adjusting the phase of the signal in the primary electrical path to match the phase of the final signal in the secondary electrical path; and recombining the primary and secondary electrical signals for providing an output signal with frequency dependent intermodulation predistortion for cancelling distortion in the nonlinear modulating device.

22. The method of reducing distortion in an amplitude modulated signal from a nonlinear modulating device comprising the steps of:

splitting an input modulation signal into primary and secondary electrical paths;

generating at least second order intermodulation distortion in the secondary electrical path and adjusting the magnitude of the intermodulation distortion to be equal in magnitude and opposite in sign to distortion inherent in a nonlinear modulating device;

adjusting the amplitude and phase of the intermodulation distortion in the secondary electrical path as a function of frequency to match the frequency dependence of distortion inherent in the modulating device;

adjusting the phase of the signal in the primary electrical path to match the phase of the final signal in the secondary electrical path;

recombining the primary and secondary electrical signals for providing an output signal with frequency dependent intermodulation predistortion for cancelling distortion in the nonlinear modulating device;

making the intermodulation distortion substantially equal in magnitude to the distortion of the nonlinear modulating device at a relatively lower frequency; and adjusting the tilt for making the intermodulation distortion generated at a relatively higher frequency substantially equal in magnitude to the distortion of the nonlinear modulating device at the relatively higher frequency without substantially changing the magnitude of the intermodulation distortion generated at the relatively lower frequency.

23. A method as recited in claim 22 comprising adjusting the time delay of the signal in one of the paths at a relatively higher frequency to be 180° out of phase with the distortion of the nonlinear device at the higher frequency.

* * * * *

UNITED STATES PATENT AND TRADEMARK OFFICE
CERTIFICATE OF CORRECTION

PATENT NO. : B1 4,992,754
DATED : October 28, 1997
INVENTOR(S) : Henry A. Blauvelt; Howard L. Loboda It is certified that error appears in the above-indentified patent and that said Letters Patent is hereby corrected as shown below:

Column 2, line 4, after "dependent" insert -- distortion --.

Signed and Sealed this

Eleventh Day of August 1998

Attest:

BRUCE LEHMAN

*Attesting Officer*  *Commissioner of Patents and Trademarks*

REEXAMINATION CERTIFICATE (3362nd)
United States Patent
Blauvelt et al.

[11] B1 4,992,754
[45] Certificate Issued  Oct. 28, 1997

[54] PREDISTORTER FOR LINEARIZATION OF ELECTRONIC AND OPTICAL SIGNALS

[75] Inventors: Henry A. Blauvelt; Howard L. Loboda, both of Los Angeles, Calif.

[73] Assignee: Ortel Corporation, Alhambra, Calif.

Reexamination Request:
No. 90/004,338, Aug. 23, 1996

Reexamination Certificate for:
Patent No.: 4,992,754
Issued: Feb. 12, 1991
Appl. No.: 404,186
Filed: Sep. 7, 1989

[51] Int. Cl.$^6$ ...................................... H03F 1/32
[52] U.S. Cl. ............................... 330/149; 359/180
[58] Field of Search ............... 330/149; 332/160; 375/297; 455/50.1, 63; 359/161, 180

[56] References Cited

U.S. PATENT DOCUMENTS

| | | | |
|---|---|---|---|
| 3,162,819 | 12/1964 | Wintringham | 329/145 |
| 3,732,502 | 5/1973 | Seidel | 330/149 |
| 3,961,172 | 6/1976 | Hutcheon | 235/181 |
| 4,035,735 | 7/1977 | Akashi et al. | 329/50 |
| 4,068,186 | 1/1978 | Sato et al. | 330/149 |
| 4,166,251 | 8/1979 | Ishigaki et al. | 329/132 |
| 4,195,360 | 3/1980 | Fothergill | 367/136 |
| 4,392,253 | 7/1983 | Yamada et al. | 455/165 |
| 4,408,352 | 10/1983 | Dudding | 455/295 |
| 4,561,113 | 12/1985 | Naito | 455/205 |
| 4,577,342 | 3/1986 | Naito | 381/13 |
| 4,698,597 | 10/1987 | Merli et al. | 328/163 |
| 4,772,855 | 9/1988 | Buoli et al. | 330/149 |
| 4,811,422 | 3/1989 | Kahn | 455/114 |
| 5,161,044 | 11/1992 | Nazarathy | 359/157 |

FOREIGN PATENT DOCUMENTS

| | | |
|---|---|---|
| 585540 | 5/1986 | Australia . |
| 078884 | 5/1983 | European Pat. Off. . |
| 132760 | 2/1985 | European Pat. Off. . |
| 280356 | 8/1988 | European Pat. Off. . |
| 55-004102 | 1/1980 | Japan . |
| 59-017736 | 1/1984 | Japan . |
| 60-025310 | 2/1985 | Japan . |
| 1519254 | 7/1978 | United Kingdom . |

OTHER PUBLICATIONS

Asatani, et al., "Linearization of LED Nonlinearity by Predistortions," *IEEE Transactions on Electron Devices*, vol. ED-25, No. 2, Feb. 1978, pp. 207–212.

Bertelsmeier, et al., "Linearization of Broadband Optical Transmission Systems by Adaptive Predistortion," *Frequenz*, vol. 38, No. 9, Sep. 1984, pp. 206–212 (plus one page).

Bertelsmeier, M., "Linearization of Optical Transmitters for the Transmission of Analog Signals via Light Wave Conductors", Department of Science of Electrical Communications Technological Institute, Darmstadt, Germany, Sections 2.4 through 7.1.1, 1984 (translation included).

(List continued on next page.)

*Primary Examiner*—James B. Mullins

[57] ABSTRACT

An electronic circuit provides a linear output from an amplitude modulated transmission device such as a solid state laser which has inherent distortion. The distortion of the nonlinear device is compensated by applying a predistorted signal equal in magnitude and opposite in sign to the distortion introduced by the nonlinear device. The input signal is split into two paths with primary part of the signal applied directly to the device, with a time delay to compensate for delays in the secondary path. A predistorter in the secondary path generates harmonic signals, the amplitude of which is adjusted to match the amplitude of the distortion. A tilt adjustment is made to compensate the amplitude of the predistortion for frequency dependence of distortion. A fine adjust of the delay is also included so that phase of the predistortion signal is in proper phase relation with the primary signal. A push-push amplifier is used as a distorter, with bias current unbalanced to produce net odd harmonics as well as even harmonics of the fundamental frequencies.

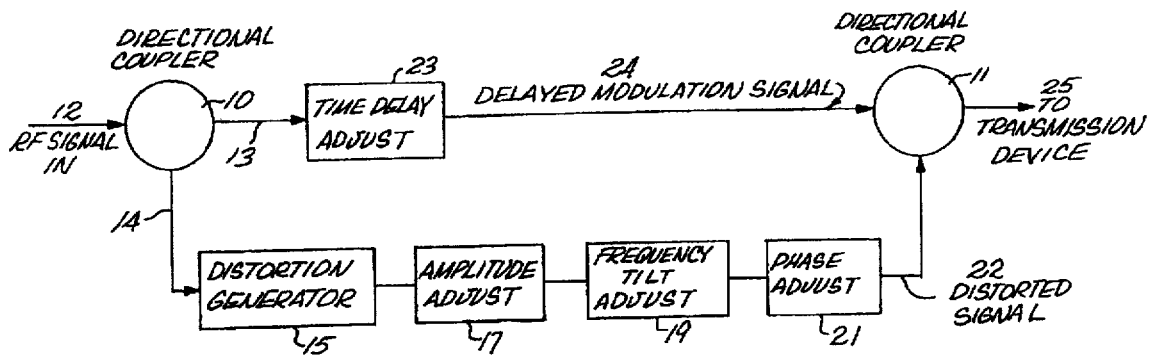

OTHER PUBLICATIONS

Chakraborty, et al., "Some aspects of wideband HPA linearizer testing", National Telesystems Conference, Calveston, 7th –10th, Nov. 1982, N.Y., U.S., pp. E 3.1.1 –E 3.1.6.

Muoi, T., "Receiver Design for High Speed Optical Fiber Systems", *IEEE Journal of Lightwave Technology*, vol. LT–2, (1984) pp. 243–267.

Nojima, et al., "Predistortion Nonlinear Compensator for Microwave SSB–Am System", *Electronics and Communications in Japan*, vol. 67, No. 5, May 1984, N.Y., U.S., pp. 57–66.

Prochazka, et al., "Amplifier Linearization by Complementary Pre–or Post–Distortion," *IEEE Transactions on Cable Television*, vol. CATV–1, No. 1, Oct. 1976, pp. 31–39.

Prokott, E., *Modulation and Demodulation*, 1978 Elitera–Verlag, pp. 76 & 77 (translation included).

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–10, 15 and 17–23 is confirmed.

Claims 11, 13, 14 and 16 are cancelled.

Claim 12 is determined to be patentable as amended.

New claims 24–32 are added and determined to be patentable.

12. A predistortion circuit as claimed in claim 11 further comprising filter means in the secondary electrical path for adjusting the relative amplitude and phase of the signal as a function of frequency such that the modulation signal is predistorted for offsetting a frequency dependent *second order* distortion of the nonlinear device.

24. *A predistortion circuit as claimed in claim 1 wherein the nonlinear device is a laser.*

25. *A predistortion circuit as claimed in claim 1 wherein the filtering means is located on the secondary electrical path between the means for generating intermodulation products and the means for additively recombining the primary and secondary paths.*

26. *A predistortion circuit as claimed in claim 11 further comprising filter means located between the distortion amplifier and second directional coupler in the secondary electrical path for adjusting the relative amplitude and phase of the signal as a function of frequency such that the modulation signal is predistorted for offsetting a frequency dependent of the nonlinear device.*

27. *A predistortion circuit as claimed in claim 11 further comprising a frequency tilt adjust located between the distortion amplifier and the second directional coupler in the secondary electrical path.*

28. *A predistortion circuit as claimed in claim 11 further comprising a frequency tilt adjust in the secondary electrical path, and wherein the second directional coupler recombines the primary and secondary signal paths into a single signal having at least frequency dependent second order intermodulation products for modulating the nonlinear device.*

29. *A predistortion circuit as claimed in claim 13 further comprising filter means located between the distortion amplifier and second directional coupler in the secondary electrical path for adjusting the relative amplitude and phase of the signal as a function of frequency such that the modulation signal is predistorted for offsetting a frequency dependent distortion of the nonlinear device.*

30. *A predistortion circuit as claimed in claim 13 further comprising a frequency tilt adjust located between the distortion amplifier and the second directional coupler in at least one of the secondary paths.*

31. *A predistortion circuit as claimed in claim 13 further comprising a frequency tilt adjust in at least one of the secondary paths, and wherein the second directional coupler recombines the primary and secondary signal paths into a single signal having at least frequency dependent second order intermodulation products for modulating the nonlinear device.*

32. *The method of claim 21 wherein the step of splitting the input modulation signal into primary and secondary electrical paths comprises the steps of splitting the signal into a plurality of secondary paths and generating one or more orders of intermodulation products of the input modulation signal.*

* * * * *